United States Patent
Vogel

[11] Patent Number: 6,027,849
[45] Date of Patent: Feb. 22, 2000

[54] ABLATIVE IMAGEABLE ELEMENT

[75] Inventor: Dennis E. Vogel, Lake Elmo, Minn.

[73] Assignee: Imation Corp., Oakdale, Minn.

[21] Appl. No.: 07/855,799

[22] Filed: Mar. 23, 1992

[51] Int. Cl.⁷ .................................................. G03F 7/012
[52] U.S. Cl. ........................ 430/167; 430/195; 430/199; 430/200; 430/201; 552/10
[58] Field of Search ..................... 430/167, 195, 430/200, 201, 199; 552/10; 428/413; 346/135.1

[56] References Cited

U.S. PATENT DOCUMENTS

| | | | |
|---|---|---|---|
| 3,158,581 | 11/1964 | Vandenberg | 260/2 |
| 3,158,591 | 11/1964 | Vandenberg | 260/88.3 |
| 3,205,183 | 9/1965 | Vandenberg | 260/2 |
| 3,314,073 | 4/1967 | Becker | 346/76 |
| 3,341,475 | 9/1967 | Vandenberg | 260/2 |
| 3,645,917 | 2/1972 | Vandenberg | 260/2 A |
| 3,650,796 | 3/1972 | Jackson et al. | 117/8 |
| 3,655,379 | 4/1972 | Gundlach | 96/27 |
| 3,745,586 | 7/1973 | Braudy | 430/201 |
| 3,787,210 | 1/1974 | Roberts | 96/27 |
| 3,794,626 | 2/1974 | Ulrich et al. | 260/78.5 |
| 3,945,318 | 3/1976 | Landsman | 101/401.1 |
| 3,962,513 | 6/1976 | Eames | 428/323 |
| 3,964,389 | 6/1976 | Peterson | 101/467 |
| 3,978,247 | 8/1976 | Braudy et al. | 427/43 |
| 4,023,185 | 5/1977 | Bloom et al. | 346/135 |
| 4,245,003 | 1/1981 | Oransky et al. | 428/323 |
| 4,356,247 | 10/1982 | Aotani et al. | 430/195 |
| 4,549,824 | 10/1985 | Sachdev et al. | 400/241.1 |
| 4,588,674 | 5/1986 | Stewart et al. | 430/273 |
| 4,626,493 | 12/1986 | Butters et al. | 430/201 |
| 4,702,958 | 10/1987 | Itoh et al. | 428/323 |
| 5,024,920 | 6/1991 | Morishita et al. | 430/195 |

FOREIGN PATENT DOCUMENTS

| | | | |
|---|---|---|---|
| 55-137523 | 10/1980 | Japan . | |
| 56-069627 | 6/1981 | Japan . | |
| WO88/03667 | 5/1988 | WIPO | G03C 172/176 |

*Primary Examiner*—John S. Chu

[57] ABSTRACT

This invention provides an imageable element comprising a substrate having on at least one major surface thereof a layer of energy-sensitive material that is capable of being developed to form a relief image upon exposure to electromagnetic radiation having a wavelength in the ultraviolet-visible-infrared range (i.e., a wavelength ranging from 150 to 1500 nm). This invention also provides methods for imaging the imageable elements of this invention. The energy-sensitive materials suitable for this invention comprise polymers containing azido groups.

12 Claims, No Drawings

ABLATIVE IMAGEABLE ELEMENT

BACKGROUND OF THE INVENTION

1. Field of the Invention

This invention relates to imageable elements, and more particularly, imageable elements that require no post-exposure development step.

2. Discussion of the Art

Printing plates are typically prepared by imagewise exposing a layer of photosensitive material that has been coated on a substrate, and then removing either the exposed or unexposed portion of the layer, i.e., wash-off development of the layer with an organic or aqueous solvent. Both organic solvents and aqueous solvents have certain shortcomings with respect to environmental pollution. Organic solvents normally used as developers are volatile, toxic, and present pollution control and waste disposal problems. Aqueous solvents normally used as developers generally have a high pH, pick up waste materials from the plate, and, consequently, also present waste disposal problems. Furthermore, development by means of a solvent is time-consuming, e.g., often on the order of five to ten minutes. Finally, development by means of a solvent requires an additional process step.

In view of the foregoing shortcomings of wash-off development, it would be desirable to provide an imageable element that dispenses with a development step that requires the use of solvents.

A recording medium sensitive to light radiation of a predetermined wavelength is described in WIPO International Publication No. WO 88103667. The recording medium comprises an energy absorbing dye and an explosive metal azide complex having an appropriate temperature of explosive decomposition. The medium can be used in optical recording and is capable of emitting significant amounts of energy on explosive decomposition. The energy from explosive decomposition causes the formation of optically detectable pits in the recording medium.

SUMMARY OF THE INVENTION

This invention provides an imageable element comprising a substrate having on at least one major surface thereof a layer of energy-sensitive composition that is capable of being developed to form a relief image upon exposure to electromagnetic radiation having a wavelength in the ultraviolet-visible-infrared range (e.g., a wavelength ranging from 150 to 1500 nm). This invention also provides methods for imaging the imageable elements of this invention.

The energy-sensitive compositions suitable for this invention comprise polymers containing pendent azido groups, specifically, polymers having a repeating unit having the formula:

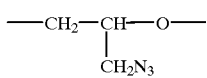

Polymers having these units are commercially available. They can also be made according to methods described in U.S. Pat. No. 3,645,917, incorporated herein by reference.

Polymers that are particularly preferred for use in this invention have the general formula:

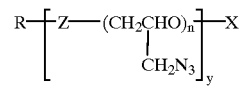

wherein

R represents either a monovalent or a polyvalent radical selected from the group consisting of alkyl groups, preferably having 1 to 10 carbon atoms, aryl groups, preferably having 6 to 10 carbon atoms, alkylene groups, preferably having 1 to 10 carbon atoms, arylene groups, preferably having 6 to 10 carbon atoms, alkanetriyl groups, preferably having from 3 to 10 carbon atoms, and alkane tetrayl groups, preferably having from 4 to 10 carbon atoms;

Z represents O, S, or $NR^1$, wherein $R^1$ represents an alkyl group, preferably having from 1 to 6 carbon atoms, an aryl group, preferably a phenyl group, or hydrogen atom;

X represents a terminating group, preferably selected from the group consisting of hydrogen atom, alkyl groups, preferably having from 1 to 18 carbon atoms, acyl groups, preferably having from 1 to 18 carbon atoms, trialkylsilyl groups, preferably having 3 to 18 carbon atoms, aryldialkylsilyl groups, preferably having 8 to 18 carbon atoms, alkyldiarylsilyl groups, preferably having 13 to 18 carbon atoms, and triarylsilyl groups, preferably having 18 to 36 carbon atoms;

n represents a positive integer greater than or equal to 2, preferably greater than 5; and y represents a positive integer greater than or equal to 1.

The layer of energy-sensitive composition may also include a radiation absorber. The layer may further include a binder. The layer may also include a crosslinking agent.

The elements suitable for use in this invention can be imaged by exposure to electromagnetic radiation, e.g., such as provided by a laser. The energy-sensitive composition can be ablated away in an imagewise manner by the source of radiation.

The imaged element can be rendered stable by exposure to heat. Upon heating of the imaged element, crosslinking occurs within the polymeric image, thereby increasing the durability of the imaged element.

The imageable element and method of imaging the imageable element allows one to dispense with a solvent development step in forming a relief image, thereby not only reducing solvent waste, but also increasing processing speed.

DETAILED DESCRIPTION OF THE INVENTION

The imageable element of this invention comprises a substrate having coated on at least one major surface thereof a layer of an energy-sensitive composition comprising a polymer containing pendent azido groups, i.e., polymers having the repeating unit having the formula:

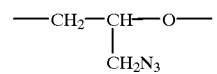

Polymers having these units are commercially available. They can also be made according to methods described in U.S. Pat. No. 3,645,917. It is preferred that the energy-sensitive composition comprise a polymer having the formula:

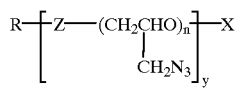

wherein
- R represents either a monovalent or a polyvalent radical selected from the group consisting of alkyl groups, aryl groups, alkylene groups, arylene groups, alkanetriyl groups, alkane tetrayl groups, the foregoing groups preferably having from 1 to 10 carbon atoms;
- Z represents O, S, $NR^1$, wherein $R^1$ represents an alkyl group, preferably having from 1 to 6 carbon atoms, an aryl group, preferably a phenyl group, or hydrogen atom;
- X represents a terminating group, preferably selected from the group consisting of hydrogen atom, alkyl groups, preferably having from 1 to 18 carbon atoms, more preferably having from 1 to 6 carbon atoms, acyl groups, preferably having from 1 to 18 carbon atoms, more preferably having from 1 to 6 carbon atoms, trialkylsilyl groups, preferably having 3 to 18 carbon atoms, more preferably having 3 to 12 carbon atoms, aryldialkylsilyl groups, preferably having 8 to 18 carbon atoms, alkyldiarylsilyl groups, preferably having 13 to 18 carbon atoms, and triarylsilyl groups, preferably having 18 to 36 carbon atoms;
- n represents a positive integer greater than or equal to 2, preferably greater than 5;
- y represents a positive integer greater than or equal to 1, preferably from 1 to 4, inclusive.

Preferably, R has from 1 to 6 carbon atoms, more preferably 2 carbon atoms. Examples of R groups include, but are not limited to, methylene, ethylene, propylene, 1,2,3-propanetriyl, phenyl, phenylene, and methyl. The choice of R is not critical provided that it has a relatively low molecular weight, typically not in excess of about 100 g/mol. Preferably, $R^1$ represents a hydrogen atom or a methyl group. Preferably, X represents hydrogen. The azido groups, i.e., the —$N_3$ groups, are preferably present at amounts of from 20 to 42% by weight, more preferably from 25 to 42% by weight, and most preferably, from 25 to 30% by weight of the layer containing the polymer that contains azido groups.

Methods for preparing the polymers containing pendent azido groups that are useful in this invention are described in U.S. Pat. No. 3,645,917.

According to U.S. Pat. No. 3,645,917, azido-methyl polyethers are prepared by reacting epihalohydrin polymers with a metal azide whereby part or all of the halogen of the halomethyl group is replaced by an azido group.

The polyethers are high molecular weight, essentially linear polyethers, wherein from 0 to 99.8% of the repeating units are epihalohydrin units, from 0 to 99.5% of the repeating units are monomer units of at least one other cyclic oxide, and from 0.2 to 100% of the repeating units having the formula:

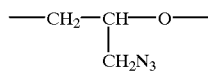

The polymers are the known crystalline and amorphous homopolymers produced from any epihalohydrin, e.g., epichlorohydrin, epibromohydrin, epiiodohydrin, or epifluorohydrin, or any mixtures of these epihalohydrins, and the known crystalline and amorphous copolymers of epihalohydrins such as epifluorohydrin, epibromohydrin, epiiodohydrin, and preferably epichlorohydrin, with up to 99.5%, preferably with up to 98% and most preferably with up to 95% by weight of the total monomers of at least one other cyclic oxide which can be an oxirane, oxetane, or tetrahydrofuran. specific oxiranes and oxetanes which can be copolymerized with epihalohydrin include the alkylene oxides having 1 to 20 carbon atoms, such as, for example, ethylene oxide, propylene oxide, butene-1 oxide, cis- and trans-butene-2 oxide; the cycloaliphatic epoxides containing 6 to 12 carbons such as cyclohexene oxide and the like; the aryl alkylene oxides such as styrene oxide, etc; the saturated glycidyl ethers such as methyl glycidyl ether, ethyl glycidyl ether, phenyl glycidyl ether, etc.; the ethylenically unsaturated epoxides such as allyl glycidyl ether, the monoepoxides or dienes or polyenes or the glycidyl esters of ethylenically unsaturated acids, etc.; and the oxetanes such as oxetane, also designated as trimethylene oxide, the 2- or 3-mono-substituted oxetanes such as 2-chlorooxetane, 3-bromooxetane, or the 2,2- or 3,3-di-substituted oxetanes. Other cyclic oxides suitable for copolymerization with the epihalohydrin include the tetrahydrofurans such as tetrahydrofuran, 2-, and 3-methyltetrahydrofuran, 2,3-dimethyltetrahydrofuran, 2,3,4-tri-methyltetrahydrofuran, 2,3-diethyltetrahydrofuran, 2,3-diphenyltetrahydrofuran, and the like. Similarly, copolymers derived from epihalohydrin and the haloalkyl glycidyl ethers such as β-chloroethyl glycidyl ether, the cis- and trans-halosubstituted alkylene oxides such as the 2-chloro-3,4-epoxybutane, 2-bromo-3,4-epoxybutane, 1,4-dichlorobutene-2-oxides, 4-chloro-butene-1-oxide, 3,4-dichlorobutene-1-oxide, 2-chloro-4,5-epoxypentane, 5-chloropentene-1-oxide, 6-bromo-pentene-1-oxide, 6-bromo-pentene-2-oxide and 1,6-dichlorohexene-3-oxide, the halosubstituted cycloalkylene oxides such as 1-chloromethyl-2,3-epoxycyclohexane, 1,2-bis-chloromethyl-3,4-epoxycyclohexane, 1-chloro-4-phenoxy-cis-2,3-epoxycyclobutane, amino epoxide monomers (or the quaternized form) such as 1-dialkylamino-2,3-epoxypropane, o-, m- or p-dialkylaminophenyl glycidyl ether, cis- or trans-1,4-bis(dialkylamino)-2,3-epoxybutane, 3- or 4-dialkylamino-1,2-epoxycyclohexane and the like can be modified in accordance with U.S. Pat. No. 3,645,917. Exemplary polymers are also described in U.S. Pat. Nos. 3,158,581; 3,158,591; 3,205,183; and 3,341,475.

The energy-sensitive composition may also comprise an optional radiation absorber, and may further comprise an optional binder.

The radiation absorber serves to sensitize the imageable element to various wavelengths of radiation. The radiation absorber operates to convert incident electromagnetic radiation into thermal energy. For this reason, it is generally desirable that the radiation absorber have low fluorescence and phosphorescence quantum efficiencies and undergo little or no net photochemistry upon exposure to electromagnetic radiation. It is also generally desirable for the radiation absorber to be highly absorptive of the incident radiation so that a relatively small amount of absorber can be used in the imageable element of this invention. Representative examples of radiation absorbers include, but are not limited to, pigments, such as carbon black (i.e., acetylene black, channel black, furnace black, gas black, and thermal black), lampblack, bone black, iron oxide (including black iron oxide), copper/chrome complex black, azo pigments (e.g., pyrazolone yellow, dianisidine red, and nickel azo yellow), and phthalocyanine pigments. Black pigments are preferred in the compositions that are useful in this invention. Carbon black pigments are particularly preferred in the compositions that are useful in this invention. Soluble radiation absorbers, such as, for example, dyes, may also be employed in this invention, provided that they are sufficiently efficient at transforming electromagnetic energy into thermal energy. When the wavelength of the radiation corresponds to an absorption band of the azido group (i.e., about 185 to about 210 nm), a radiation absorber is unnecessary, and the polymer itself may serve as the radiation absorber. The layer containing the polymer containing azido groups preferably has an absorbance of from about 0.2 to about 0.7, more preferably from about 0.5 to about 0.7, most preferably from about 0.5 to about 0.55. As used herein, absorbance is equal to $$-\log\frac{(\text{Transmitted light})}{(\text{Incident light} - \text{Reflected light})}$$

The layer of energy-sensitive composition suitable for this invention may be made by coating a substrate with a mixture comprising a polymer that contains azido groups and a radiation absorber. However, it is generally preferable that the polymer that contains azido groups be crosslinked to provide a coating having greater durability. Preferred crosslinking agents for the polymers containing azido groups are polyisocyanates.

While it is expected that virtually any polymeric binder can be used in this invention, it is preferable that the polymeric binder be crosslinked. Methods for forming crosslinked polymeric binders are well known in the polymer art. Examples of binders suitable for this invention include, but are not limited to, urethanes, acrylates and acrylamides, polyesters, polyols, epoxies, etc. These binders can be crosslinked or uncrosslinked. Preferably, the binder is a polyol that has been crosslinked with a diisocyanate. The binder may be present in amounts ranging from 0 to 30% by weight, preferably 15 to 25% by weight, and more preferably 15 to 20% by weight of the energy-sensitive composition.

Coating can be carried out by methods well known in the art such as, for example, knife, slot, and hand spread coating techniques. Coating thicknesses ranging from about 0.0005 mm to about 1 mm can be employed. Preferably, coating thicknesses range from about 0.001 mm to about 0.025 mm, and more preferably range from about 0.001 mm to about 0.010 mm.

Substrates that are suitable for this invention include, but are not limited to, metallic substrates, e.g., steel and aluminum and surface treated aluminum plates, sheets, and foils; films or plates composed of various film-forming synthetic or high molecular weight polymers including addition polymers, e.g., poly(vinylidene chloride), poly(vinyl chloride), poly(vinyl acetate), polystyrene, polypropylene, polyisobutylene polymers and copolymers, and linear condensation polymers, e.g., poly(ethylene terephthalate), poly (hexamethylene adipate), poly(hexamethylene adipamide/adipate); substrates derived from cellulosic materials, such as paper and cardboard; and glass. In order to maintain integrity of the substrate, it is preferable to use substrates that are thermally stable up to a temperature of 350° C. Poly(ethylene terephthalate) and aluminum are preferred substrates, with poly(ethylene terephthalate) being particularly preferred.

The layer of energy-sensitive compositions of the present invention may contain minor amounts of various additional materials in combination with the essential ingredients. For example, a stabilizer may be added to enhance thermal stability of the polymer containing the azido group.

Exposure of the imageable element must be carried out by use of a source of high intensity electromagnetic radiation, such as, for example, a laser, in order to bring about ablation. Suitable lasers include, but are not limited to, gas lasers such as helium-neon, nitrogen, and carbon dioxide lasers, including excimer gas lasers, such as krypton fluoride, xenon fluoride, and hydrogen chloride lasers; solid state lasers such as ruby and yttrium aluminum garnet (YAG) lasers, and optically pumped dye lasers, including liquid cell and dye jet lasers. Exposure to infrared radiation is preferred. Exposure may be made at a wavelength anywhere in the range of from about 150 nm to about 1500 nm. The total amount of energy transferred to the layer of energy-sensitive composition in exposed areas is typically greater than about 2.5 J/cm$^2$/mm thickness of the layer. The duration of exposure can range from periods as short as nanoseconds up to several minutes. Determination of appropriate laser power for individual imageable elements of this invention can be easily made by simple variation of laser power and observation of the results.

The element and process of this invention can be used to prepare relief images. The portion of the element exposed to radiation employed in the process is ablated by the radiation. The portion of the element that remains unexposed constitutes the raised surface of the resulting imaged element. Ablation is believed to result from thermal decomposition of the azido groups.

Where the term "group" is used in describing substituents, substitution is anticipated on the substituent; for example, alkyl group includes alkoxyalkyls (e.g., CH$_3$CH$_2$CH$_2$—O—CH$_2$—), haloalkyls, nitroalkyls, carboxyalkyls, hydroxyalkyls, etc. Substituents which adversely react with active ingredients, such as very strong acids, would, of course, be undesirable as not being inert or harmless.

EXAMPLES

Unless otherwise specified, all chemical materials employed in the following examples were obtained from Aldrich Chemical Company (Milwaukee, Wis.). GAP-diol refers to a polymeric resin having a molecular weight of 2440 and having the empirical formula:

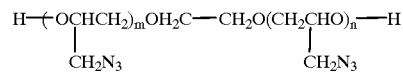

Example 1

This example describes a method for preparing an imageable element of the present invention.

GAP-diol (2.0 g, available from Minnesota Mining and Manufacturing Company, St. Paul, Minn., also capable of being prepared according to U.S. Pat. No. 3,645,917), carbon black (0.188 g, "Regel 300 R", obtained from Cabot Corp., Tuscola, Ill.), and methyl ethyl ketone (2.0 ml) were mixed in a ball mill for two days. To this mixture was added a solution of isophorone diisocyanate (0.175 g) and a polyisocyanate having 3–4 functionality and an equivalent weight of 180 g/eq. (0.450 g, "Desmodur D-3200", obtained from Mobay, Pittsburgh, Pa.) in methyl ethyl ketone (1 ml). The mixture was coated onto a poly(ethylene terephthalate) film by means of #7 Mayer bar (a wire wound rod obtained from R & D Specialties, Webster, N.Y.) to provide a coating having a wet thickness of 0.016 mm. The coating was cured in an oven at a temperature of 75° C. and a pressure of 15 torr for 30 minutes to give a non-tacky layer.

Example 2

This example demonstrates the imaging of an element of this invention by means of a source of high intensity electromagnetic radiation having a wavelength in the infrared region of the spectrum.

Samples of the imageable element prepared in Example 1 were placed on a 12-inch diameter drum, then exposed to radiation from a continuous wave carbon dioxide laser (10.6 μm, defocussed to about a 2 mm spot size) by scanning the laser beam along the cylindrical axis of the drum as it was rotated at 1,000 rpm. At 400 watts incident power and a horizontal scan speed of 2.1 cm/sec, clean ablation was observed to create a pattern of parallel lines having a positive-tone.

Example 3

The process of Example 2 was repeated with a sample coated onto anodized aluminum sheeting instead of poly (ethylene terephthalate). Only faint images were obtained under the same conditions as were used in Example 2.

Example 4

This example demonstrates the imaging of an element of this invention by means of a source of high intensity electromagnetic radiation having a wavelength in the ultraviolet region of the spectrum.

A sample was prepared and exposed as in Example 2, with the following exceptions. The carbon black was omitted, aluminum sheeting was used instead of poly(ethylene terephthalate), and an ArF excimer laser (193 nm, about 2 mm spot size) was used. The sample was exposed as a flat sheet, rather than being placed on a rotating drum. Pulse energy was approximately 43 mJ/cm$^2$ in the exposed region. Clean positive-tone relief images were obtained at a scan rate of 0.1 in/min and a repetition rate of 20 Hz. Faint images were observed at scan rates of 1 and 2 in/min and repetition rates of 20 and 15 Hz, respectively.

Example 5

This example demonstrates the imaging of an element of this invention by means of a source of high intensity electromagnetic radiation having a wavelength in the visible region of the spectrum. This example further demonstrates the power requirements for clean ablation.

GAP-diol (2.0 g, available from Minnesota Mining and Manufacturing Company, St. Paul, Minn.), carbon black (0.01 to 0.5 g per sample, "Regel 300 R", obtained from Cabot Corp., Tuscola, Ill.), and methyl ethyl ketone (2 ml) were mixed in a ball mill for two days. To this mixture was added a solution of a poly-isocyanate having 3–4 functionality and an equivalent weight of 180 g/eq. (0.308 g, "Desmodur D-3200", obtained from Mobay, Pittsburgh, Pa.) and one drop of dibutyltin dilaurate in methyl ethyl ketone (1 ml). The mixture was coated onto a poly(ethylene terephthalate) substrate. Several samples were made and each was heated to a temperature of 100° C. in an oven at a pressure of 760 torr and held at that temperature for ½ to 1 hour to give a non-tacky layer. The samples were exposed to 532 nm radiation from a frequency doubled Nd:YAG laser with a pulse width of 8 ns. The results are set forth in Table II.

TABLE II

| Sample | Absorbance of sample | Incident power at 532 nm (megawatt/cm$^2$) | Absorbed energy (mJ/cm$^2$) | Observation |
|---|---|---|---|---|
| A | 0.53 | <45 | <361 | residue |
|   |      | 45  | 361  | clean ablation |
| B | 0.58 | <57 | <451 | residue |
|   |      | 57  | 451  | clean ablation |
| C | 0.05 | <8.3 | <66.6 | no change |
|   |      | 8.3  | 66.6  | some ablation/some substrate damage |
| D | 0.77 | <64 | <508 | residue |

Absorbance was determined by the following formula:

$$\text{Absorbance} = -\log\frac{(\text{Transmitted light})}{(\text{Incident light} - \text{Reflected light})}$$

Incident power at 532 nm in megawatts per square centimeter was calculated as follows:

$$\text{Incident power (watts/cm}^2) = \frac{\text{Energy absorbed (J/cm}^2)}{\text{Pulse width at half height (sec)}}$$

Absorbed energy in millijoules per square centimeter was calculated as follows:

$$\text{Absorbed energy (mJ/cm}^2) = \frac{P^{(1-10^{-A})} \text{ (mJ)}}{\text{Area (cm}^2)}$$

where
 A=Absorbance
 P=Pulse energy

The data from Table II indicate that the amount of power must be varied in accordance with optical density of the energy-sensitive composition in order to achieve clean ablation.

Various modifications and alterations of this invention will become apparent to those skilled in the art without departing from the scope and spirit of this invention, and it should be understood that this invention is not to be unduly limited to the illustrative embodiments set forth herein.

What is claimed is:

1. An imageable element comprising a substrate having coated on at least one major surface thereof a layer comprising a polymer containing pendent azido groups, wherein said polymer has a repeating unit having the formula

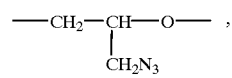

said layer being capable of being imaged upon exposure to electromagnetic radiation to form either a positive or a negative relief image without the need for a solvent development step, said layer further comprising a radiation absorber.

2. An imageable element comprising a polymeric substrate having coated on at least one major surface thereof a layer comprising a polymer containing pendent azido groups, wherein said polymer has a repeating unit having the formula

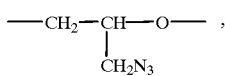

said layer capable of being imaged upon exposure to electromagnetic radiation to form either a positive or a negative relief image without the need for a solvent development step, said layer further comprising a radiation absorber.

3. The element of claim 1 wherein said polymer has the general formula:

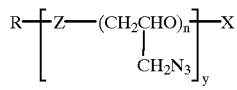

wherein

R represents a monovalent or a polyvalent radical selected from the group consisting of alkyl groups, aryl groups, alkylene groups, and arylene groups, alkanetriyl groups, and alkane tetrayl groups;

Z represents O, S, or $NR^1$, wherein $R^1$ represents an alkyl group, a phenyl group, or hydrogen;

X represents a terminating group;

n represents a positive integer greater than or equal to 2; and y represents a positive integer greater than or equal to 1.

4. The element of claim 3, wherein y represents a positive integer from 1 to 4, inclusive.

5. The element of claim 3, wherein R has from 1 to 10 carbon atoms.

6. The element of claim 3, wherein $R^1$ has from 1 to 6 carbon atoms.

7. The element of claim 3, wherein X is selected from the group consisting of hydrogen, alkyl groups having from 1 to 18 carbon atoms acyl groups having from 1 to 18 carbon atoms, trialkylsilyl groups having from 3 to 18 carbon atoms, aryldialkylsilyl groups having from 8 to 18 carbon atoms, alkyldiarylsilyl groups having 13 to 18 carbon atoms, and triarylsilyl groups having from 18 to 36 carbon atoms.

8. The element of claim 1 wherein said radiation absorber is carbon black.

9. The element of claim 1, wherein said layer further comprises a binder.

10. The element of claim 1 further including a crosslinking agent.

11. The element of claim 1 wherein said electromagnetic radiation is in the ultraviolet-visible-infrared range.

12. The element of claim 1 wherein said layer has been applied at a coating thickness ranging from about 0.0005 mm to about 1 mm.

* * * * *